United States Patent [19]

Yamazaki

[11] Patent Number: 4,913,336
[45] Date of Patent: Apr. 3, 1990

[54] METHOD OF TAPE BONDING

[75] Inventor: Nobuto Yamazaki, Tokyo, Japan

[73] Assignee: Kabushiki Kaisha Shinkawa, Tokyo, Japan

[21] Appl. No.: 304,784

[22] Filed: Jan. 31, 1989

[30] Foreign Application Priority Data

Mar. 29, 1988 [JP] Japan .................................. 63-73243

[51] Int. Cl.[4] ...................... B23K 20/00; B23K 20/16
[52] U.S. Cl. .................................. 228/106; 228/180.2; 228/5.5; 228/6.2; 228/44.7
[58] Field of Search ............ 228/5.5, 106, 179, 180.2, 228/6.2, 44.7

[56] References Cited

U.S. PATENT DOCUMENTS

| | | | |
|---|---|---|---|
| 3,627,190 | 12/1971 | Ramsey | 228/106 |
| 3,743,558 | 7/1973 | Ludwig | 228/106 |
| 3,901,429 | 8/1975 | Boyer et al. | 228/5.5 |
| 3,909,915 | 10/1975 | Phillips | 228/5.5 |
| 4,607,779 | 8/1986 | Burns | 228/106 |
| 4,657,170 | 4/1987 | Müller | 228/5.5 |

Primary Examiner—Richard K. Seidel
Assistant Examiner—Samuel M. Heinrich
Attorney, Agent, or Firm—Koda & Androlia

[57] ABSTRACT

A tape bonding method using an intermediate member provided between a bonding tool and a carrier tape having leads thereon. The intermediate member is made of a polyimide film, metal foil, glass material, elastic material, etc. and can be in a form of endless belt provided between a driving pulley and a driven pulley.

2 Claims, 2 Drawing Sheets

METHOD OF TAPE BONDING

BACKGROUND OF THE INVENTION

1. Field of the Invention

The present invention relates to a method of tape bonding for bonding either bumps installed on a pellet or independent bumps to leads provided on a carrier tape.

2. Prior Art

In a conventional tape bonding method, bumps on pellets are bonded to leads of a carrier tape as disclosed, for example, in Japanese Patent Publication Nos. 57-53974, 62-27735 and 62-55298. In another conventional method, independent bumps are bonded to the leads of a carrier tape as disclosed, for example, in Japanese Patent Publication Nos. 62-31819 and 62-34142. In both of these methods, bonding of bumps to leads installed on a carrier tape is accomplished by pressing a bonding tool heated to approximately 600° C. directly against the leads.

However, since the bonding tool is heated to a high temperature and is pressed directly against the leads, foreign materials such as copper oxide, tin plating, adhesive solvents, etc., are likely to adhere to the tip of the bonding tool.

In addition, bonding tools are generally made of an SUS alloy, and such alloys are susceptible to severe wear and adhesion of foreign materials. If a ruby is embedded in the tip of the bonding tool, the problem of wear is slightly alleviated, but there is no improvement in terms of adhesion of foreign materials. If a diamond is embedded in the tip of the bonding tool, wear is greatly reduced, but there is still no improvement in terms of the adhesion of foreign materials.

Accordingly, such bonding tools must be cleaned at regular intervals after a given number of uses. The frequency of cleaning varies depending upon the lead material; however, frequent cleaning after every 50 to 200 bonds is required. Thus, the productivity problems arise.

SUMMARY OF THE INVENTION

The object of the present invention is to provide a tape bonding method which requires no cleaning of the bonding tool and is therefore superior in terms of productivity.

The abovementioned and other objects of the present invention are achieved by performing bonding with an intermediate material provided between the bonding tool and the carrier tape. With such a method, the bonding tool is pressed against the leads with the intermediate material interposed between the bonding tool and the leads and accordingly, foreign materials such as copper oxide, etc., generated by the heating of the leads, do not adhere to the bonding tool.

DETAILED DESCRIPTION OF THE INVENTION

Figure 1:
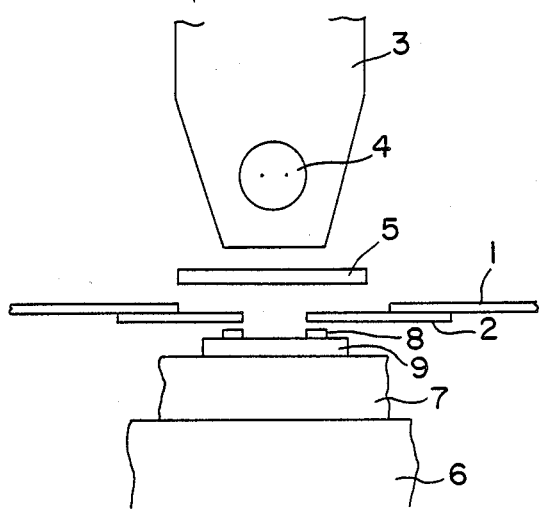
FIG. 1 is a schematic front view which illustrates one embodiment of the present invention.

An embodiment of the present invention will be described below with reference to FIGS. 1 and 2.

A multiple number of leads 2 are provided in a specified order on a carrier tape 1 which is made of a polyimide film, etc. The carrier tape 1 is wound on a supply reel (not shown), led underneath a bonding tool 3 from the supply reel, and then taken up on a take-up reel (not shown), A heater 4 is provided in the bonding tool 3, and the bonding tool 3 can be moved vertically (in the Z direction) and horizontally (in the X and Y directions) by a driving means (not shown).

An intermediate member 5 which is a material such as polyimide film, metal foil, glass material, elastic member, etc., having a heat-resistance temperature exceeding 600° C., is installed between the carrier tape 1 and the bonding tool 3.

A vacuum suction-adhesion table 6 is provided beneath the bonding tool 3 and carrier tape 1. This vacuum suction-adhesion table 6 can be moved horizontally (in the X and Y directions), vertically (in the Z direction) and rotationally (in the $\theta$ direction) by a driving means (not shown). The vacuum suction-adhesion table 6 holds a substrate 7 thereon by vacuum suction-adhesion. Pellets 9 which have bumps 8 are bonded to the substrate 7 via an adhesive tape, etc. Only one pellet 9 is shown in the drawings; however, in actual use, a multiple number of pellets 9 are provided at equal intervals on the substrate 7.

In operation, when the carrier tape 1 has been fed and the leads 2 that are to be bonded are properly positioned, and when the vacuum suction-adhesion table 6 has been moved in the X and Y directions and the bumps 8 on the pellet 9 that are to be bonded are aligned with the leads 2, the vacuum suction-adhesion table 6 is raised so that the bumps 8 contact the leads 2. The bonding tool 3 is moved in the X and Y directions and lowered so that it presses the leads 2 against the bumps 8 through the intermediate member 5. As a result, the bumps 8 are bonded to the leads 2. Afterward, the bonding tool 3 is raised and moved in the X and Y directions, and the vacuum suction-adhesion table 6 is lowered.

The carrier tape 1 is then fed a fixed distance so that the next leads 2 that are to be bonded are positioned underneath the bonding tool 3. Afterward, the abovementioned operation is repeated so that the bumps 8 are successively bonded to the leads 2.

Thus, since the bonding tool 3 is pressed against the leads 2 with the intermediate material 5 interposed between the bonding tool 3 and leads 2, no foreign material such as copper oxide, etc., generated by the heating of the leads 2, adheres to the bonding tool 3.

Figure 2:
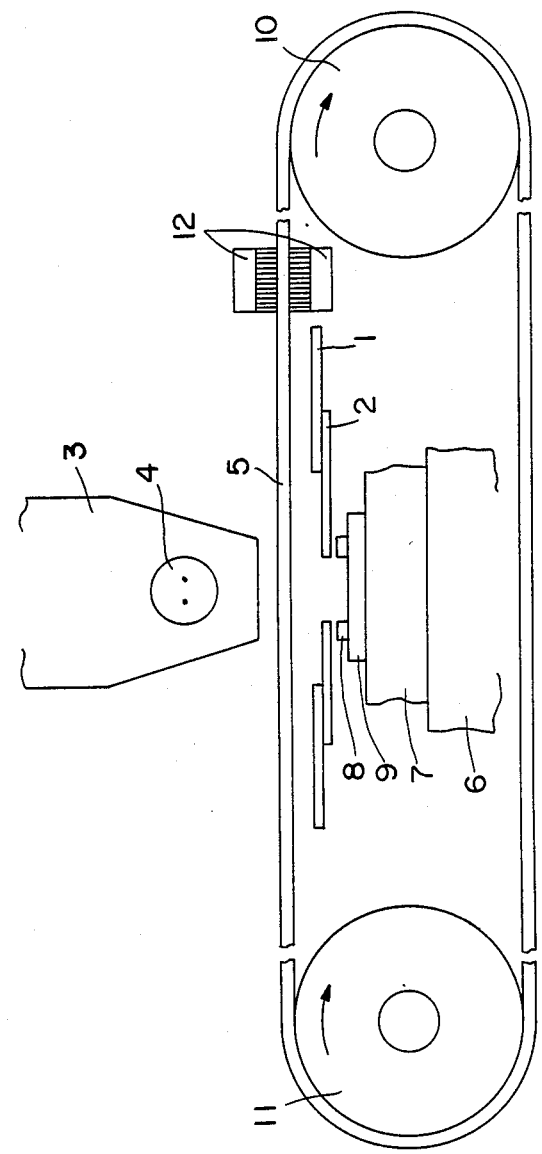
FIG. 2 is a schematic front view which illustrates one embodiment of an arrangement of the intermediate member.

FIG. 2 illustrates one way to use the intermediate member 5. Though the intermediate member 5 may simply be installed between the carrier tape 1 and the bonding tool 3 as described above, the intermediate member 5 may also be in the form of an endless belt provided between a driving pulley 10 and a driven pulley 11 as shown in FIG. 2. Much more desirable results can be obtained if brushes 12, which remove foreign materials from the belt form intermediate member 5, are provided on the upper and lower surfaces of the intermediate member 5. Means which remove foreign materials by suction or blown air can be used as well. The intermediate member 5 may also be installed as a reel take-up system.

In the above embodiments, the pellets 9, that is, the bumps 8 installed on pellets 9 are bonded to the leads 2. However, it goes without saying that the method of the present invention can be applied to bond independent bumps 8 to leads 2. Furthermore, any of the abovementioned materials may be used for the intermediate member 5; however, if an elastic material is used, bonding is performed without regard to the degree of parallel orientation of the tip of the bonding tool 3.

As is clear from the above description, the bonding tool is pressed against the leads with an intermediate member between the bonding tool and leads. As a result, no foreign material such as copper oxide, etc., generated by the heating of the leads adheres to the bonding tool. Thus, there is no need to clean the bonding tool, and there is no need to shut down the apparatus for cleaning. Therefore, the method of the present invention is superior in terms of productivity.

I claim:

1. A tape bonding method characterized in that leads provided on a carrier tape are bonded to bumps by means of a bonding tool with an intermediate member provided between said bonding tool and carrier tape, said intermediate member is an endless belt provided between a driving pulley and a driven pulley and brushes which remove foreign materials from said endless belt are provided on the upper and lower surfaces of the intermediate member.

2. A tape bonding method according to claim 1, wherein said intermediate member comprises materials selected from the group consisting of a polyimide film, metal foil, glass materials, and elastic materials.

* * * * *